United States Patent [19]

Palkovich et al.

[11] Patent Number: 5,003,266

[45] Date of Patent: Mar. 26, 1991

[54] PASSIVELY IMPROVING MAGNETIC FIELD HOMOGENEITY

[75] Inventors: Alex Palkovich, Oxford, United Kingdom; Ratson Morad, Zichron Yokov, Israel

[73] Assignee: Elscinct Ltd., Haifa, Israel

[21] Appl. No.: 379,353

[22] Filed: Jul. 12, 1989

[30] Foreign Application Priority Data

Jul. 20, 1988 [IL] Israel ........................................ 87162

[51] Int. Cl.⁵ ............................................. G01R 33/20
[52] U.S. Cl. ..................................... 324/320; 324/319
[58] Field of Search ............... 324/300, 307, 309, 318, 324/319, 320, 322

[56] References Cited

U.S. PATENT DOCUMENTS 4,743,853  5/1988  Frese ..................................... 324/318

Primary Examiner—Michael J. Tokar
Attorney, Agent, or Firm—Sandler, Greenblum & Bernstein

[57] ABSTRACT

Shim holding independently accessible open cavities are attached to the magnet bore. The holding independently accessible open cavities are arranged in rows and columns to provide readily identifiable locations. The shim holding indpendently accessible open cavities increase the effeciency of shimming to improve the homogeneity of magnets in magnetic resonance systems.

20 Claims, 1 Drawing Sheet

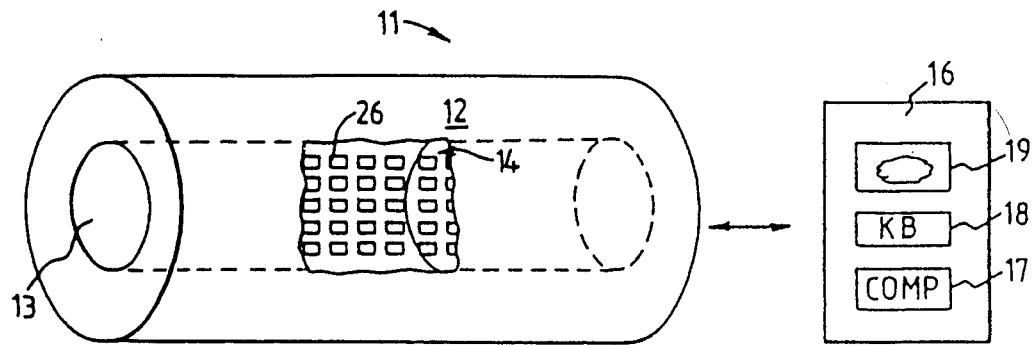
FIG.1.
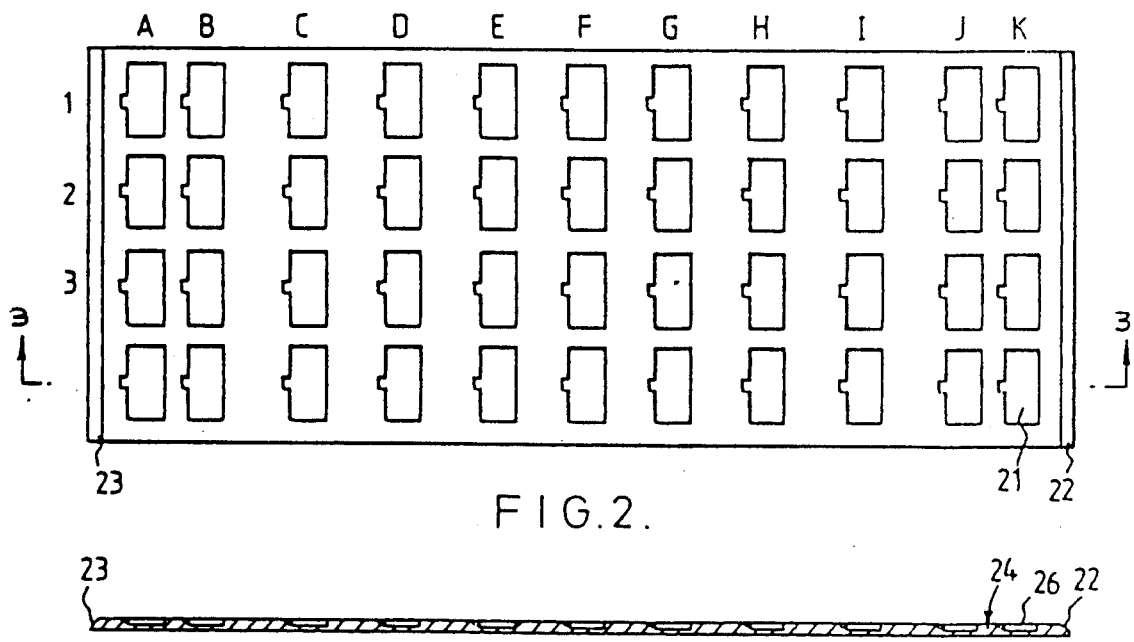
FIG.2.
FIG.3.
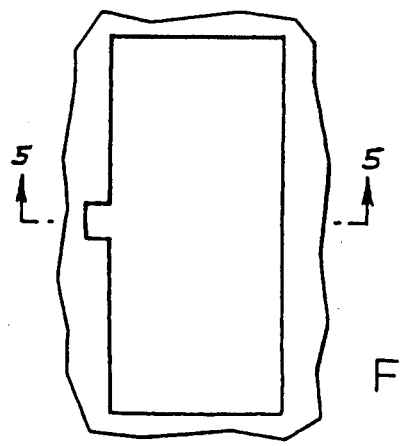
FIG.4.
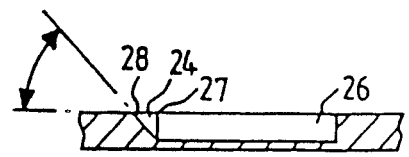
FIG.5.

PASSIVELY IMPROVING MAGNETIC FIELD HOMOGENEITY

FIELD OF THE INVENTION

This invention is concerned with magnetic resonance systems and more particularly with the passive shimming of such systems.

BACKGROUND OF THE INVENTION

A uniform or homogeneous magnetic field is a keystone criterion of magnetic resonance systems. In theory a uniform current density over the surface of a sphere will produce a perfectly uniform magnetic field within the sphere. However, spheres are not used in magnetic resonance systems, instead solenoids are used for generating the main static magnetic field that must be uniform or homogeneous. Solenoids are used because they are easily suspended as a single unit in a cryogenic environment. The uniformity of the magnetic field generated by the solenoid increases as the solenoid increases in length relative to its diameter. Practical considerations, however, limit the length of the superconducting magnets, i.e. the solenoids used in magnetic resonance imaging systems. In general the superconducting magnets that have an outside diameter of 2 meters and are 2 meters in length can be adjusted to have a field uniformity of 25 parts per million or better over the 50 cm. diameter imaging region.

The necessity for homogeneous fields can easily be understood when, for example, one considers that the difference in resonance frequencies of different chemicals is something in the order of about 10 parts per million. In hydrogen magnetic resonance imaging it is known that the difference between hydrogen in water molecules and hydrogen in fat molecules is in the order of 3 parts per million. It is readily apparent that the more homogeneous the static magnetic field is the more accurate is the information that is obtained by the magnetic resonance system.

There are two types of systems used for improving the homogeneity of the magnetic fields generated by the magnetic resonance equipment. They are commonly referred to as: passive shimming and active shimming.

Active shimming comprises the use of a plurality of additional coils strategically placed within the magnet so as to improve the homogeneity of the main static magnetic field when these additional supplementary or active shimming coils are energized. The use of active shimming coils provides benefits and detriments. The benefits include the fact that it is relatively easy to change the effects of the shimming coil by varying the currents individually in each of the shimming coils. However, the shimming coils tend to counteract each other. Thus when the current in a shimming coil is varied to correct an inhomogeneity in one section of the magnetic field an inhomogeneity may be generated in another section (or another degree of the magnetisim). Hence, variations may be required in the current input to selected ones of the other shimming coils. Therefore, time consuming iterative variations in the shimming coil currents are necessary to obtain the desired magnetic field uniformity.

Passive shimming is accomplished by attaching magnetizable metallic sections within the magnet so as to vary the magnetic field distribution in efforts to improve the homogeneity. With relatively small nuclear resonance spectrographic equipment, shimming is relatively easy since the magnets in such equipment are relatively small, and therefore; it is easier to measure the field and easier to vary the field either passively or actively. However, with the onset of the use of magnetic resonance imaging systems, shimming either passively or actively became much more difficult since, among other things, the size of the magnetic field which must be homogeneous is greatly enlarged. Due to the relative ease of varying the homogeneity of the field using shim coils a lot of the inhomogeneity correction is done with active shimming.

Relatively recently passive shimming has been aided by software programs that have been devised. The programs use data from measurements of the homogeneity of the field to indicate where "iron" (shims) has to be placed to improve the homogeneity of the field. By iteratively, strategically placing the shims as indicated by the program eventually the field homogeneity is brought to the desired standard. However, because of the large number of repetitive shim placement steps required passive shimming remains extremely time consuming even with the use of the computerized algorithms for indicating where the shims should be placed to correct the field inhomogeneity. The passive shimming described herein can shim at least ten harmonics in the axial direction compared to five using prior art active shimming.

One of the reasons that passive shimming is so time consuming is that up to now there has been no efficient method of holding and locating the shims in accordance with the computerized indications of shim locations. Accordingly, it is an object of the present invention to provide means for denoting shim locations that can be coordinated with the shimming programs and for removably retaining the shims in the places indicated by shimming programs.

BRIEF DESCRIPTION OF INVENTION

In accordance with a preferred embodiment of the present invention, a system for passive shimming of magnetic resonance equipment is provided, said passive shimming system using a computerized program to indicate shim locations, said system comprising:
  shims,
    said shims being of magnetizable metal,
    holding means attached to the bore of said main magnet for removably holding said shims and enabling independent accessibility at the locations indicated by the computerized program, and
    said holding means comprising readily identifiable locations for the shims.

According to a feature of the invention the holding means includes independently accessible open cavities, hereinafter sometimes referred to as pockets in said holding means located in a matrix arrangement on the holding means. Thus, the shims are readily insertable in and removable from whichever pockets are identified by the computer program. For example, the computer program may indicate that single shims are required at locations A2, C3, D4, etc., whereas multiple shims are required at locations B4, D2, E3, etc.

It has been found that by using the pocket holding means having readily identifiable pockets that are easily located relative to the used part of the large static magnetic field, the number of iterations necessary for placing the passive shims within the magnet to provide usable and desired magnetic homogeneity has been cut to a bare minimum. In fact, in a preferred embodiment two or three iterations are all that are necessary, whereas prior to the use of the inventive holding means at least 20 iterations were required to obtain the desired homogeneity.

BRIEF DESCRIPTION OF THE DRAWINGS

The above mentioned and other features and objects of the present invention will be best understood when viewed in the light of the following description of a broad aspect of the present invention made in conjunction with the accompanying drawings; wherein:

FIG. 1 is a pictorial representation of the main magnet in a magnetic resonance system;

FIG. 2 is a plan view of a passive shim tray used for holding the shims in the main magnet;

FIG. 3 is a sectional view of the tray taken along line AA and looking in the direction of the arrows in FIG. 2;

FIG. 4 is a detailed plan view of a preferred pocket in the inventive tray; and

FIG. 5 is a sectional view of the pocket taken along line CC and looking in the direction of the arrows in FIG. 4.

GENERAL DESCRIPTION

FIG. 1 shows at 11 a magnetic resonance imaging system equipped with shim holder means. Magnet 12 is the magnet that provides the main static magnetic field in the magnetic resonance (MR) systems. The magnet 12 has a bore 13 for receiving the patient therein. Attached to the inside of the bore are the shim holders 14.

The magnet 12 is shown as being connected to a magnetic resonance imaging (MRI) console 16. The console includes a processor 17 for controlling the operation of the system. Input means such as keyboard 18 is provided for inputting information and instructions to the processor. Display means 19 is used for displaying images or graphs obtained by the magnetic resonance system.

The shim holder means 14 as shown is a plurality of shim trays and is characterized by two outstanding features. They are the "pockets" for easily retaining and removing the shims, which in the preferred embodiment are made of sheet metal such as transformer steel. The other feature of the shim tray is the ease of coordinating the location information provided by the computerized program with location identifications in the shim tray.

The plan view of FIG. 2 which shows an individual shim tray 14a emphasizes these features. In a preferred system, six such trays are connected around the inner circumference of the bore 13. Each tray in the preferred embodiment, comprises 44 pockets for the shims. The pockets are shown as pockets such as pocket 21 and are arranged in rows such as rows 1, 2, 3 and 4 and columns A, B . . . K, L.

In a preferred embodiment the columns are arranged with different spacings. Thus, the centers of columns A and B are spaced apart by approximately 160 mm whereas the centers between B and C are spaced apart by about 280 mm and the centers columns between C and D are spaced apart by 260 mm. The centers between columns E and D are also spaced apart by 160 mm. The centers between columns EF and columns FG are spaced apart by 120 mm. The spacing is symmetrical on the other side of center line on which column F is located.

The scope of the invention covers any spacing of the columns and rows. The center of the pockets of the rows in a preferred embodiment are spaced apart by 149.2 mm with spacing between rows 2 and 3 being 129.6 mm. Here again the spacing of the rows 3 and 4 are symmetrical with the spacing of the rows 1 and 2.

The ends of each of the tray have tapered sections 22 and 23 for adjusting the trays to the perimeter of the bore of the magnet. In the preferred embodiment as shown in FIG. 3, the depth of the tray is just slightly larger than the depth of the pockets.

As shown in FIG. 4 means are provided in each of the pockets for an enabling tool to be inserted to aid in removal of sheet metal shims. These means are indicated by the notch 24 at the side of the pocket. It is noted that in a preferred embodiment the pocket is approximately twice as long as it is wide. The notch 24 is coupled directly to the main body section 26 of the pocket.

The depth of the pocket as shown in FIG. 5 extends practically over the complete depth of the tray.

Notch 24 is shown as having a tapered wall 27 designed so that if a screwdriver or a pick is placed within the notch 24 the edge 28 of the tapered wall 27 can be used for leverage to remove a sheet metal shim.

The sheet metal is dimensioned so that in a preferred embodiment approximately three sheets may be conveniently placed within each of the pockets. In the preferred embodiment, the taper of wall 28 is approximately 45 degrees. Further, in a preferred embodiment, the shim tray is moulded from silicon rubber with the pockets moulded therein. In practice the tray could be made of material such as linoleum and the pockets can be cut within the tray. However, in the preferred embodiment, the pockets are moulded to be integral to the shim tray. When the trays are completely moulded, six of the trays are aligned and glued to the inner circumference of the bore. This provides 264 pockets each capable of easily receiving three sheet metal shims.

When the magnet is energized, the magnetic homogeneity is measured. The measurements are provided to the micro processor or computer and a software program indicates where and how many sheet metal shims should be placed in each of the locations for correcting the measured inhomogeneity.

In operation, responsive to a computerized program indicating sheet metal shim locations for correcting inhomogeneities, the shims are placed into the pockets of the tray. Measurements are again taken and the shims are withdrawn and/or added to pockets to once again correct the last measured inhomogeneities. The iterations are repeated until the desired parts per million homogeneity is achieved. In a preferred embodiment it has been noted that with the passive shim tray as described herein, the iterations are down to two or three when previously up to 20 and 30 iterations were required.

While the invention is described using an example embodiment, it should be understood that the described embodiment is made by way of example only and not as a limitation on the scope of the invention, which scope is to be defined by the accompanying claims.

What is claimed is:

1. A system for passively improving homogeneity of the main magnet in magnetic resonance systems by shimming the main static magnetic field,
    said main magnet including a bore therein for receiving patients in the main magnet, said shimming being done responsive to computerized indications of shim locations, said system comprising:

shims, tray means attached to the bore of said magnet, said tray means including means for holding said shims in independently accessible locations in accordance with the computerized indications of the shim locations, and said tray means comprising location indications providing readily identifiable locations for the shims.

2. The system of claim 1, wherein said tray means comprises plurality of independently accessible open cavities for receiving said shims.

3. The system of claim 2, wherein the surface dimensions of the shims are slightly smaller than the opening dimensions of said independently accessible open cavities whereby said shims press fit into said cavities.

4. The system of claim 2, wherein thickness dimension of said shims is less than the depth of said cavities whereby a plurality of shims fit into each independently accessible open cavity.

5. The system of claim 3 wherein glue means are provided for affixing the shims to said holding means.

6. The system of claim 5 wherein said cavities are shaped to enhance the removal of said shims from said cavities.

7. The system of claim 2, wherein said shim trays have said cavities arranged in rows and columns, with each row and column separately identified.

8. The system of claim 7 wherein said rows and columns are unevenly spaced to provide effective shimming even to the tenth harmonic.

9. The system of claim 8 wherein means are provided to attach said trays to each other forming a cylinder within said bore.

10. The system as in any one of claims 7-9 wherein said shim trays are glued to the bore of said main magnet.

11. The system of claim 2 wherein the thickness dimension of said shims in less than the depth of said pockets whereby a plurality of shims fit into each pocket.

12. The system of claim 1 wherein glue means are provided for affixing the shims to said holding means.

13. The system of claim 2 wherein glue means are provided for affixing the shims to said holding means.

14. The system of claim 2 wherein said pockets are shaped to enhance the removal of said shims from said pockets.

15. The system of claim 3 wherein said pockets are shaped to enhance the removal of said shims from said pockets.

16. The system of claim 4 wherein said pockets are shaped to enhance the removal of said shims from said pockets.

17. The system of claim 2 wherein said holding means comprises a plurality of shim trays, said shim trays having said pockets arranged in rows and columns with each row and column separately identified.

18. The system of claim 3 wherein said holding means comprises a plurality of shim trays, said shim trays having said pockets arranged in rows and columns with each row and column separately identified.

19. The system of claim 4 wherein said holding means comprises a plurality of shim trays, said shim trays having said pockets arranged in rows and columns with each row and column separately identified.

20. The system of claim 5 wherein said holding means comprises a plurality of shim trays, said shim trays having said pockets arranged in rows and columns with each row and column separately identified.

* * * * *